United States Patent
Jones et al.

(10) Patent No.: US 7,998,852 B2
(45) Date of Patent: Aug. 16, 2011

(54) METHODS FOR FORMING AN RF DEVICE WITH TRENCH UNDER BOND PAD FEATURE

(75) Inventors: Jeffrey K. Jones, Chandler, AZ (US); Margaret A. Szymanowski, Chandler, AZ (US); Michele L. Miera, Gilbert, AZ (US); Xiaowei Ren, Phoenix, AZ (US); Wayne R. Burger, Phoenix, AZ (US); Mark A. Bennett, Glasgow (GB); Colin Kerr, South Lanarkshire (GB)

(73) Assignee: Freescale Semiconductor, Inc., Austin, TX (US)

( * ) Notice: Subject to any disclaimer, the term of this patent is extended or adjusted under 35 U.S.C. 154(b) by 246 days.

(21) Appl. No.: 12/328,319

(22) Filed: Dec. 4, 2008

(65) Prior Publication Data

US 2010/0140814 A1 Jun. 10, 2010

(51) Int. Cl.
*H01L 21/44* (2006.01)

(52) U.S. Cl. .............. 438/612; 257/786; 257/E21.59; 257/E23.023

(58) Field of Classification Search .............. 257/786, 257/E21.59, E23.023; 438/612
See application file for complete search history.

(56) References Cited

U.S. PATENT DOCUMENTS

| | | | |
|---|---|---|---|
| 4,139,442 A | 2/1979 | Bondur et al. | |
| 5,190,889 A | 3/1993 | Poon et al. | |
| 5,217,919 A | 6/1993 | Gaul et al. | |
| 5,504,033 A | 4/1996 | Bajor et al. | |
| 5,707,894 A | 1/1998 | Hsiao | |
| 5,933,746 A | 8/1999 | Begley et al. | |
| 5,986,343 A | 11/1999 | Chittipeddi et al. | |
| 6,271,100 B1 | 8/2001 | Ballantine et al. | |
| 6,790,751 B2 | 9/2004 | Tsuruta et al. | |
| 7,087,925 B2 | 8/2006 | Grivna | |
| 7,250,669 B2 | 7/2007 | Chan et al. | |
| 7,276,425 B2 | 10/2007 | Averett et al. | |
| 7,326,625 B2 | 2/2008 | Jeong et al. | |
| 2003/0062588 A1* | 4/2003 | Grivna | 257/510 |
| 2006/0267008 A1 | 11/2006 | Tsao et al. | |

FOREIGN PATENT DOCUMENTS

EP 0291014 B1 4/1993

OTHER PUBLICATIONS

PCT Application No. PCT/US2009/065902; Search Report and Written Opinion dated Jun. 15, 2010.

* cited by examiner

*Primary Examiner* — Thanh V Pham
*Assistant Examiner* — Marvin Payen
(74) *Attorney, Agent, or Firm* — Ingrassia Fisher & Lorenz, P.C.

(57) ABSTRACT

Electronic elements (44, 44', 44") having an active device region (46) and bonding pad (BP) region (60) on a common substrate (45) desirably include a dielectric region underlying the BP (35) to reduce the parasitic impedance of the BP (35) and its interconnection (41) as the electronic elements (44, 44', 44") are scaled to higher power and/or operating frequency. Mechanical stress created by plain (e.g., oxide only) dielectric regions (36') can adversely affect performance, manufacturing yield, pad-to-device proximity and occupied area. This can be avoided by providing a composite dielectric region (62, 62', 62") having electrically isolated inclusions (65, 65', 65') of a thermal expansion coefficient (TEC) less than that of the dielectric material (78, 78', 78") in which they are embedded and/or closer to the substrate (45) TEC. For silicon substrates (45), poly or amorphous silicon is suitable for the inclusions (65, 65', 65") and silicon oxide for the dielectric material (78, 78', 78"). The inclusions (65, 65', 65") preferably have a blade-like shape separated by and enclosed within the dielectric material (78, 78', 78").

20 Claims, 10 Drawing Sheets

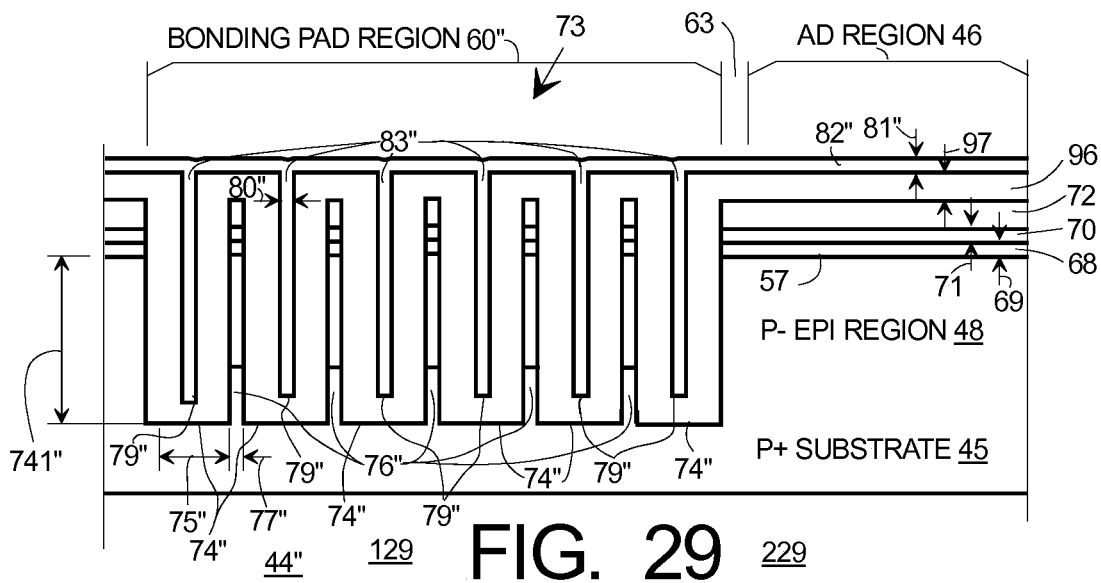
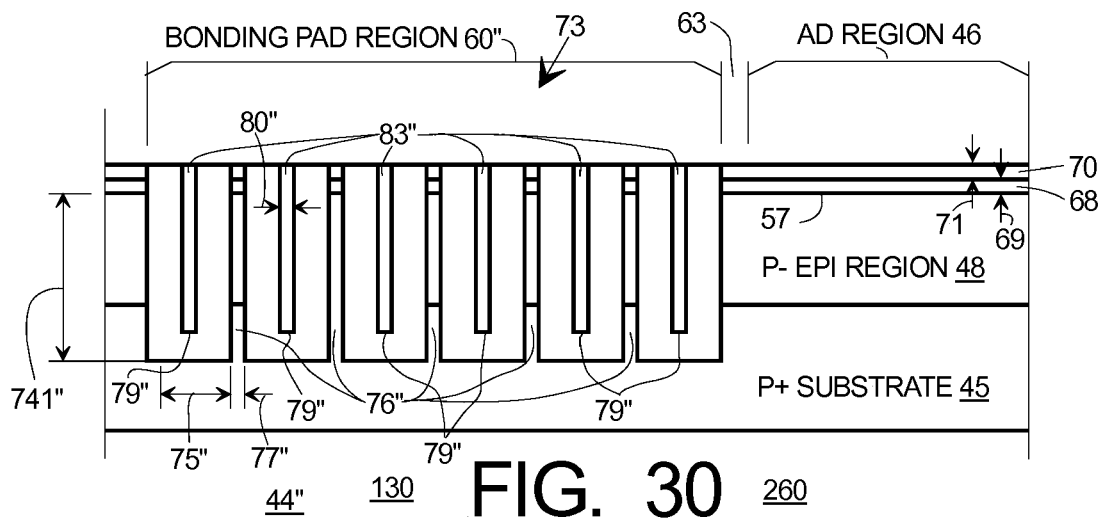
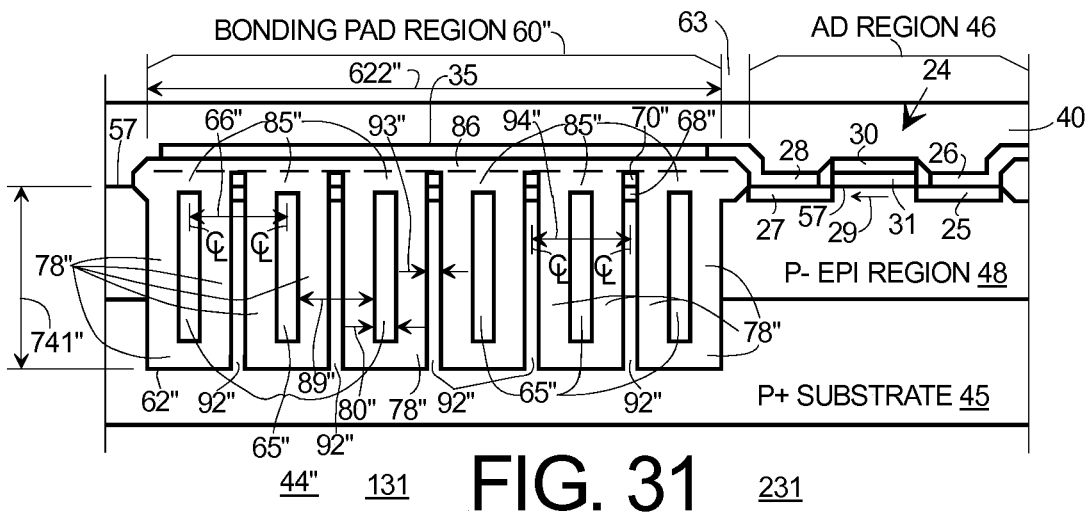

US 7,998,852 B2

METHODS FOR FORMING AN RF DEVICE WITH TRENCH UNDER BOND PAD FEATURE

FIELD OF THE INVENTION

The present invention generally relates to semiconductor (SC) devices and integrated circuits (ICs) and their methods of manufacture, and more particularly, structures and methods for providing radio frequency (RF) power devices and ICs embodying an insulator filled trench under bond pad feature.

BACKGROUND OF THE INVENTION

The performance of radio frequency (RF) power devices and integrated circuits (ICs) is particularly sensitive to the terminal impedances associated with connections to the devices or ICs. This is particularly true for metal-oxide-semiconductor (MOS) field-effect-transistors (MOSFETs) and laterally-diffused-metal-oxide-semiconductor (LDMOS) field effect transistors (FETs) where low resistivity substrates (e.g., <0.1 Ohm-cm) are often used to enhance the active device performance. Electro-magnetic (E-M) coupling to such low resistivity substrates can make it difficult or impossible to provide the desired impedance matching at the input-output (I/O) terminals of such devices and preserve the desired power output and efficiency. Further, such E-M coupling can give rise to eddy current losses in the substrate that can further degrade device and IC performance. These problems become more severe with high periphery devices and higher frequency (e.g., >~1 GHz) devices since the intrinsic device impedance drops with increasing periphery and increasing frequency, and E-M losses increase as the size of the terminal connections (e.g., the bonding pads) increases.

FIG. 1 shows simplified electrical schematic block diagram 10 of field effect transistor (FET) 24 (e.g., a MOSFET) whose gate 14 is coupled to an input bonding pad (IP-BP) 12 by input interconnection 13 and whose drain 16 is coupled to an output bonding pad (OP-BP) 35 by output interconnection 41. At RF frequencies, interconnections 13 and 41 can behave as transmission lines and are accordingly also referred to as input transmission line (IP-TL) 13 and output transmission line (OP-TL) 41. External connection 11 (e.g., a wire bond or other interconnection) sees input impedance $Z'_{in}$ at input bonding pad (IP-BP) 12 and external connection 19 (e.g., a wire bond or other interconnection) sees output impedance $Z'_{out}$ at output bonding pad (OP-BP) 35. Input interconnection (e.g., transmission line (IP-TL)) 13 couples input bonding pad (IN-BP) 12 to MOSFET 24 that has intrinsic input impedance $Z_{in}$ at gate 14, and output interconnection (e.g., transmission line (OP-TL)) 41 couples drain output 16 of FET 24 that has intrinsic output impedance $Z_{out}$ at drain 16 to output bonding pad (OP-BP) 35. FIG. 2 shows simplified equivalent circuit diagram 10' of block diagram 10 of FIG. 1. Conductances G1, G2, capacitances C1, C2, inductance L1 and resistance R1 represent IN-BP 12. Conductances G3, G4, capacitances C3, C4, inductance L2 and resistance R2 represent IN-TL 13. Transistor 24 is represented by intrinsic impedances $Z_{in}$ and $Z_{out}$ and amplifier A. Conductances G5, G6, capacitances C5, C6, inductance L3 and resistance R3 represent OP-TL 41. Conductances G7, G8, capacitances C7, C8, inductance L4 and resistance R4 represent OP-BP 35.

As the frequency of operation and/or the gate periphery of transistor 24 increase, the intrinsic transistor terminal impedances $Z_{in}$ and $Z_{out}$ becomes smaller, since they scale with frequency and gate periphery. The gate periphery is the twice the sum of the gate width plus gate length, neglecting the slight difference that may exist between gate length and channel length. Gate periphery increases with increasing power handling capability because, effectively, more and more FETS are being operated in parallel. This is visible in various FETS by use of multiple "fingers" coupled in parallel, each finger forming an individual FET. Thus, the decrease in intrinsic impedance is a direct consequence of the need for devices operating at higher power and/or higher frequency, especially for operation at or above about 1 GHz. As the intrinsic impedance $Z_{in}$ and $Z_{out}$ becomes smaller, the parasitic impedances of the interconnections (e.g., IP-TL 13, OP-TL 41) and bonding pads (e.g., IP-BP 12 and OP-BP 35) as illustrated in FIGS. 1-2, can become dominant, so that it becomes difficult or impossible to efficiently couple energy into and out of device 24. These parasitic impedances can act as signal stealing voltage dividers. For example, referring now to FIG. 2, the fraction of an input signal presented at terminal 11 that appears at gate 14 to drive transistor 24 is given by the ratio of $Z_{in}$ divided by the sum of $Z_{in}$ plus $Z_{(IN-BP)}+Z_{(IP-TL)}$, where $Z_{(IN-BP)}$ is the series impedance presented by input bonding pad (IN-BP) 12 and $Z_{(IP-TL)}$ is the series impedance presented by input transmission line (IN-TL) 13. With electronic elements represented by block diagram 10 and equivalent circuit 10' intended for operation at higher frequency and/or higher power (thereby having smaller $Z_{in}$) the terms $Z_{(IN-BP)}+Z_{(IP-TL)}$ begin to dominate and this voltage divider action reduces the amount of drive that reaches transistor 24. An analogous effect occurs at the output between drain 16 of transistor 24 and output terminal 19. Unless steps are taken to scale the bonding pad and transmission line impedances at the same time as the intrinsic input-output device impedances scale with frequency and/or power handling capability, overall higher frequency operation and higher power handling capability cannot be reasonably achieved.

Thus, a need continues to exist for improved device structures and fabrication methods therefore that reduce the parasitic E-M coupling associated with the terminals and coupling elements of such high frequency devices and ICs, typically the bonding pads and/or interconnections used to couple such high frequency devices and/or ICs to such bonding pads and external leads and/or other components.

BRIEF DESCRIPTION OF THE DRAWINGS

The present invention will hereinafter be described in conjunction with the following drawing figures, wherein like numerals denote like elements, and wherein:

FIGS. 27-31 show simplified schematic cross-sectional views through a semiconductor substrate at different stages of manufacture of the dielectric regions of FIGS. 6-14 adapted to support bonding pads, according to yet still further embodiments of the present invention.

DETAILED DESCRIPTION OF THE INVENTION

Figure 1:
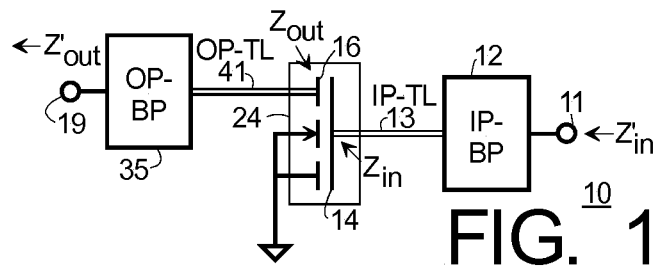
FIG. 1 is a simplified electrical schematic block diagram of a field effect transistor (FET) whose gate is coupled to an input bonding pad and whose drain is coupled to an output bonding pad.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction or manufacturing stages, and descriptions and details of well-known features and techniques may be omitted to avoid unnecessarily obscuring the invention. Additionally, elements in the drawings figures are not necessarily drawn to scale. For example, the dimensions of some of the elements or regions or layers in the figures may be exaggerated relative to other elements or regions or layers to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation or fabrication in sequences other than those illustrated or otherwise described herein. Furthermore, the terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus. The term "coupled," as used herein, is defined as directly or indirectly connected in an electrical or non-electrical manner.

As used herein, the term "semiconductor" is intended in general to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline and amorphous structures, thin film structures, layered structures as for example and not intended to be limiting, semiconductor-on-insulator (SOI) structures, and combinations thereof. The term "semiconductor" is abbreviated as "SC." The terms "wafer" and "substrate", singular or plural, are intended refer to supporting structures that are relatively thin compared to their lateral surface area and used in connection with batch fabrication of electronic devices. Non-limiting examples of such wafers and substrates include: semiconductor wafers, SOI wafers, and other types of supporting structures in or on which active and/or passive electronic elements are fabricated or that are used in connection with the fabrication of such elements.

For convenience of explanation and not intended to be limiting, electronic structures (e.g., active and passive devices and elements and combinations thereof) and methods of fabrication of the various embodiments of the present invention are described herein for silicon semiconductors and dielectrics formed of silicon oxides, but persons of skill in the art will understand that other semiconductor and dielectric materials can also be used. Also, for convenience of explanation, active devices in the form of MOSFET devices and/or LDMOS transistors may be illustrated or described, but this is not intended to be limiting and persons of skill in the art will understand that any type of active device may be used in the active device regions of the various embodiments of the invention, and that the term metal-oxide-semiconductor (and the abbreviation MOS) in connection with any such devices is not limited merely to oxide gate dielectrics and/or metal gate or source-drain conductors but includes any type of insulating dielectric (organic or inorganic) in place of "oxide" and any type of conductor (organic or inorganic) in place of "metal" in such devices.

In the description that follows, various examples are described of a bonding pad coupled to the output terminal (e.g., drain) of an active device (e.g., a MOSFET), but this is intended merely for convenience of description and not intended to be limiting. Persons of skill in the art will understand that the discussion and examples provided herein with respect to a device output terminal and associated output bonding pad and interconnection also apply to a device input terminal and associated input bonding pad and interconnection. Further, the structure and method for providing improved performance, cost reduction and efficiency apply to all of the terminals of an electronic structure formed on a semiconductor substrate that are not connected to the substrate, that is, to all device and element terminals whose E-M substrate coupling can give rise to deleterious effects.

Figure 3:
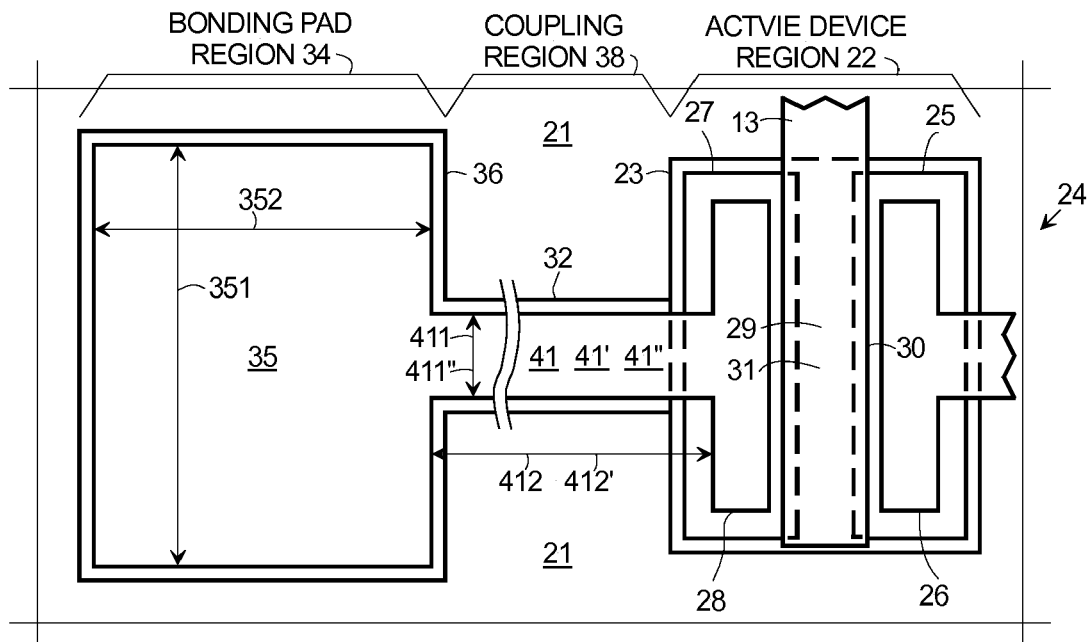
FIG. 3 is a simplified schematic plan view of an electronic device embodying a field effect transistor in an active device region and a coupled bonding pad in a bonding pad region.
Figure 4:
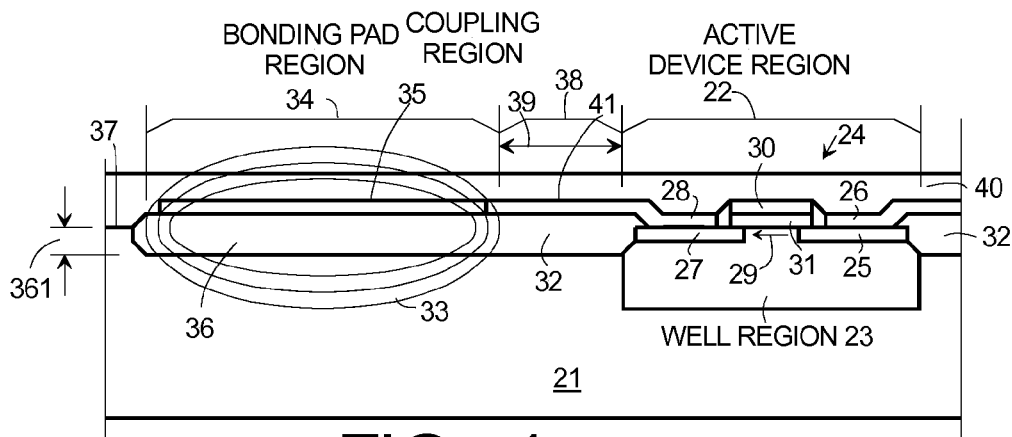
FIG. 4 is a simplified schematic cross-sectional view of an electronic device consistent with FIG. 3 embodying a field effect transistor in an active device region and a coupled bonding pad in a bonding pad region, according to the prior art.

FIG. 3 is a simplified schematic plan view and FIG. 4 is a simplified schematic cross-sectional view of electronic device 20 embodying MOS field effect transistor (FET) 24 in active device region 22 coupled to bonding pad 35 in bonding pad region 34 by interconnection 41 of coupling region 38. FIG. 4 is according to the prior art. Electronic device 20 comprises semiconductor substrate 21 (e.g., silicon) in which has been formed doped well region 23 in which MOSFET 24 is formed. Substrate 21 is presumed to be a low resistivity material, for example having a sheet resistance less than about 0.1 Ohm-cm but higher or lower values can also be used. Located in well region 23 are spaced-apart elements: (i)

source region 25 with source contact 26, and (ii) drain region 27 with drain contact 28. Channel region 29 surmounted by gate oxide 31 and gate 30 lies between source-drain regions 25, 27. When device 24 is energized, current flows between source 25 and drain 27 through field induced channel region 29, the polarity of the current depending upon whether transistor 24 is an N-channel or P-channel type FET. While transistor or device 24 is illustrated as being a MOSFET, any type of active device may be substituted, as for example and not intended to be limiting, JFET devices, LDMOS devices, bipolar devices, and so forth. Despite being identified as MOSFET transistor or device 24, device 24 is intended to also be representative of such other device types and drain electrode 28 is also intended to represent a principal terminal of such other device types.

Bonding pad 35 is coupled to drain electrode 28 by interconnection 41. Bonding pad 35 typically has width 351 in the range of about 3 to 7 millimeters for a FET with a total gate periphery of approximately 80 mm, and length 352 in the range of about 75 to 200 micrometers, or an area in the range of about 0.225 to 1.4 mm², but larger or smaller values can also be used. Interconnection 41 typically has width 411 in the range of about 7 to 60 micrometers per millimeter of gate periphery but larger and smaller values can also be used, and length 412, 412' of interconnect 41 can vary over a wide range depending upon the needs of the designer. Interconnection 41 is insulated from substrate 21 by dielectric region 32 (e.g., silicon oxide) and bonding or connection pad 35 is insulated from substrate 21 by dielectric region 36 (e.g., silicon oxide) of thickness 361. As used herein, the terms "bonding pad" and "pad", singular or plural, are intended to refer to any type of significant area I/O connection for the electronic devices described herein. In FIG. 4, coupling region 38 of length 39 analogous to length 412 of FIG. 3 exists between active device region 22 and bonding pad region 34. While only one bonding pad (e.g., pad 35) is shown in FIGS. 3-4 (and analogously in subsequent figures), those of skill in the art will understand that there is usually a generally similar bonding pad coupled to gate 30 or other active terminals of transistor 24.

When device 20 with transistor 24 is energized, electromagnetic (E-M) field 33 forms around bonding pad 35 in bonding pad region 34. Because of the relative large area of pad 35 compared to drain contact 28 and relatively short interconnection 41, E-M field 33 associated with pad 35 can dominate the parasitic effects associated with the properties of high frequency (e.g., RF) device 20. To the extent that E-M field 33 penetrates into low resistivity substrate 21, parasitic coupling can occur that degrades the performance of device 20, for example, by dominating the terminal I/O impedance so that it is difficult or impossible to achieve adequate input-output (I/O) impedance matching and coupling into and out of transistor 24, as has been discussed above. In such situation, the power handling capability and maximum frequency of operation of device 20 can be seriously degraded.

Figure 5:
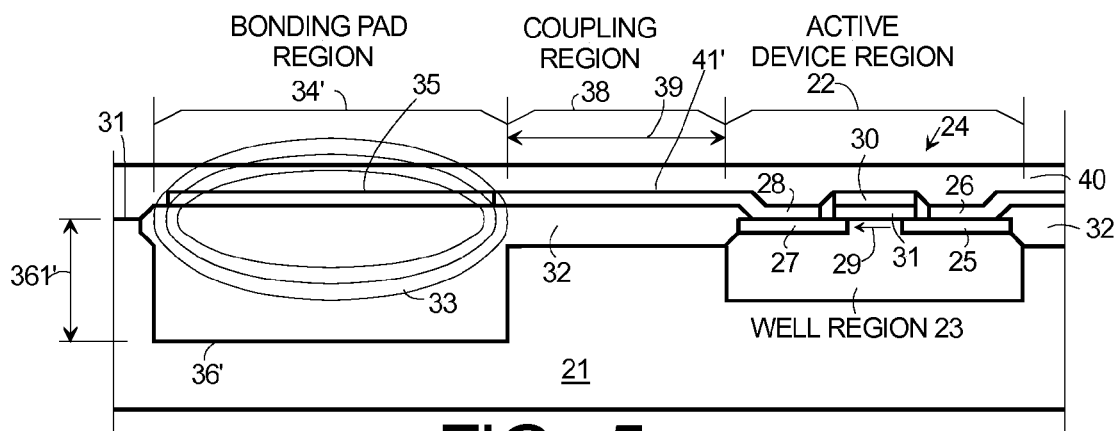
FIG. 5 is a simplified schematic cross-sectional view of another electronic device consistent with FIG. 3 embodying a field effect transistor in an active device region and a coupled bonding pad in a bonding pad region.

FIG. 5 is a simplified schematic cross-sectional view of electronic device 20' embodying field effect transistor (FET) 24 in active device region 22 coupled to bonding pad 35 in bonding pad region 34'. Electronic device 20' of FIG. 5 differs from electronic device 20 of FIG. 4 by provision of relatively deep dielectric region (DDR) 36' (e.g., of silicon oxide) underlying pad 35, that is, having depth 361' that is substantially greater than thickness 361 of field oxide dielectric region 36 of FIG. 4. Depth 361' is usefully equal or greater than about 5 micrometers, more conveniently equal or greater than about 10 micrometers, and preferably equal or greater than about 15 micrometers, but larger and smaller values can also be used. Because of the presence of DDR 36', E-M field 33 no longer interacts so significantly with substrate 21. The E-M coupling between pad 35 and substrate 21 are much reduced, although the E-M coupling between interconnection 41' and substrate 21 can be larger or smaller depending upon length 39', 412' (and width 411) of interconnection 41' and the thickness of underlying dielectric 32. As a consequence, the impedance associated with pad 35 is easier to match and the eddy current losses and other parasitic effects otherwise present in the arrangement of FIG. 4 can be less significant. Thus, the arrangement of FIG. 5 may reduce overall device performance degradation, compared to the arrangement of FIG. 4.

Figure 2:
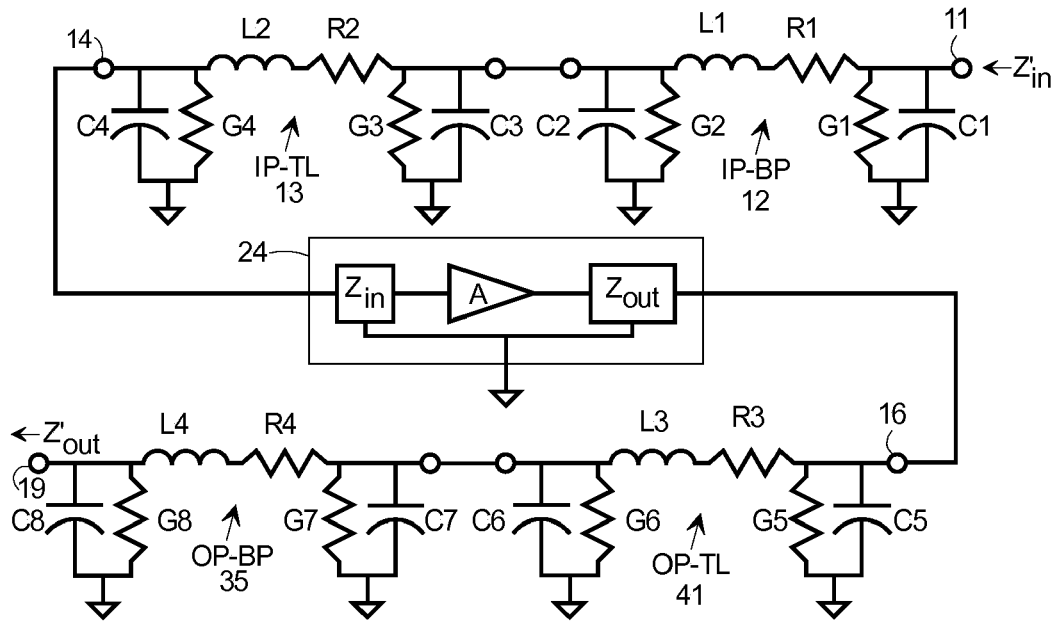
FIG. 2 is a simplified equivalent circuit diagram of the block diagram of FIG. 1.

However, it is found that another problem can arise that can make the arrangement of FIG. 5 less than ideal. This has to do with the mechanical stresses created in substrate 21 by the presence of DDR 36'. For example, the thermal expansion coefficient (TEC) of silicon oxide useful for forming DDR 36' is greater than the TEC of substrate 21 of, for example, silicon. This creates significant stress in substrate 21 as device 20 is subjected to various thermal cycles during and after manufacture. This stress can adversely affect the properties of whatever active device 24 is located in active device region (ADR) 22. The closer that DDR 36' is placed to active device region (ADR) 22, that is, the smaller length 39' of coupling region 38' and length 412' of interconnection 41', the greater the deleterious effect that the mechanical stress produced by DDR 36' can have on active device 24. This is generally true no matter what type of active device 24 is used in active device region (ADR) 22 and is not limited merely to exemplary MOSFET 24 shown in the figures. Thus, to take advantage of the reduction in parasitic E-M effects provided by the structure of FIG. 5 without suffering from deleterious stress induced effects when DDR 36' is close to ADR 22, it is often necessary to increase length 39' of coupling region 38' and length 412' of interconnection 41'. This results in device 20' occupying larger area (referred to as "area bloat"), which in turn decreases the number of devices or IC's incorporating device 20' that can be fabricated simultaneously on a single wafer. This results in higher manufacturing cost. Further, the increase in length 412' of interconnection 41' caused by increasing length 39' of coupling region 38' can an add undesirable series impedance as explained in connection with FIGS. 1-2, thereby also limiting the overall performance of device 20'.

Figure 6:
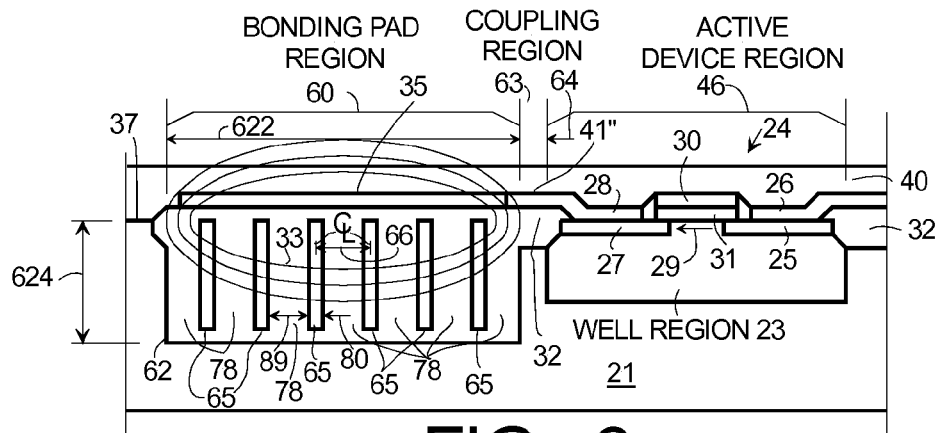
FIG. 6 is a simplified schematic cross-sectional view of an electronic device embodying a field effect transistor in an active device region and a coupled bonding pad in a bonding pad region, according to an embodiment of the present invention.
Figure 7:
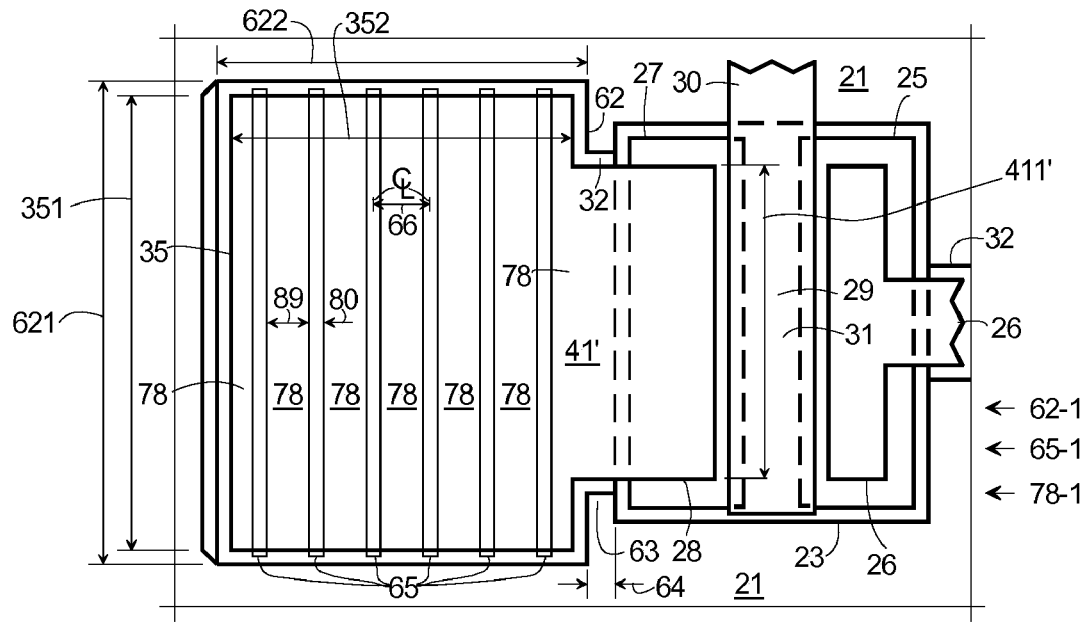
FIGS. 7-8 are simplified schematic plan views of the electronic device of FIG. 6 embodying a field effect transistor in an active device region and a coupled bonding pad in a bonding pad region, according to further embodiments of the present invention.
Figure 8:
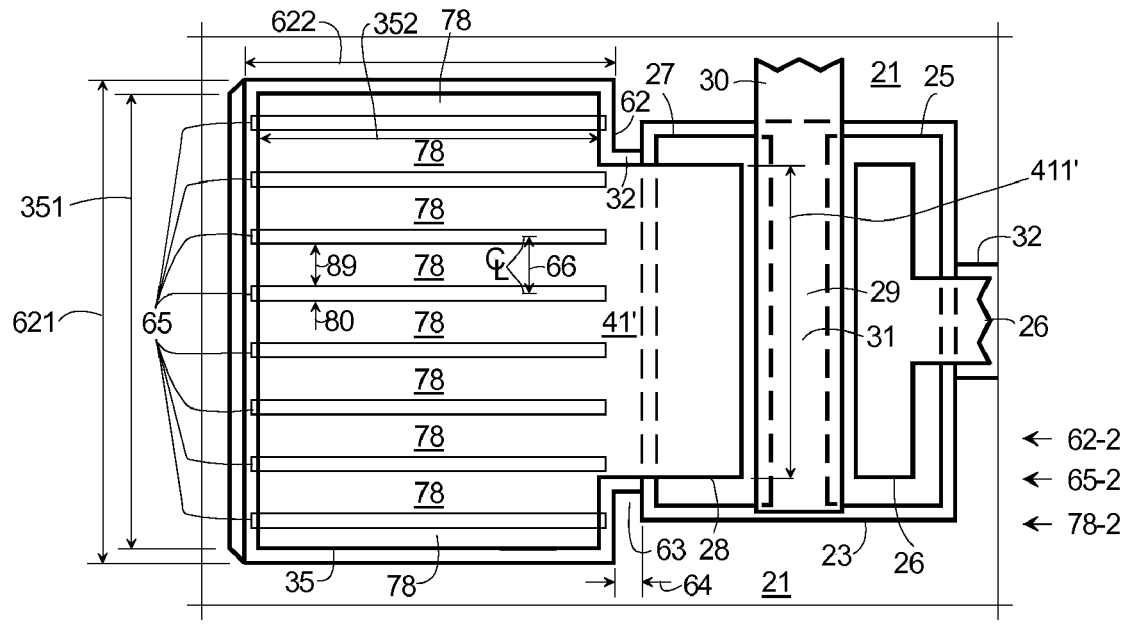
Figure 9:
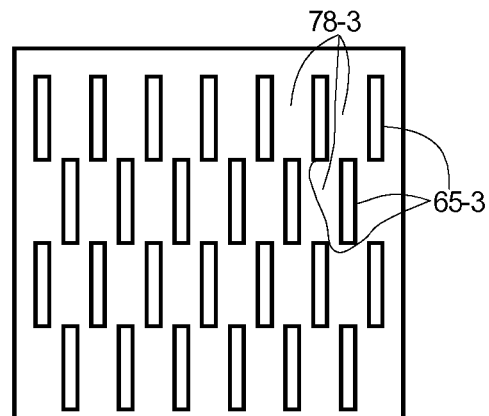
FIGS. 9-14 are simplified schematic plan views of various dielectric regions underlying the bonding pad regions of the device of FIGS. 6-8, according to still further embodiments of the present invention.
Figure 10:
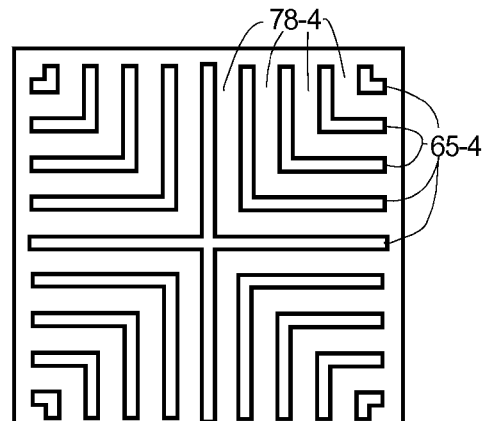
Figure 11:
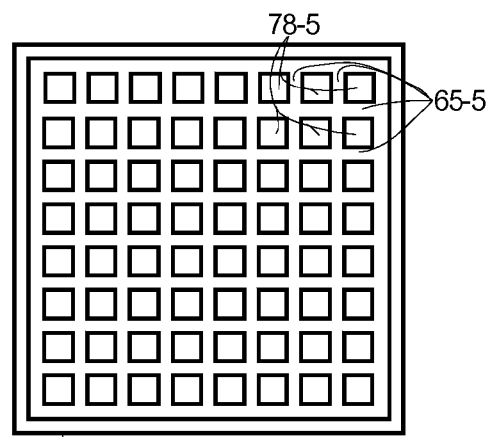
Figure 12:
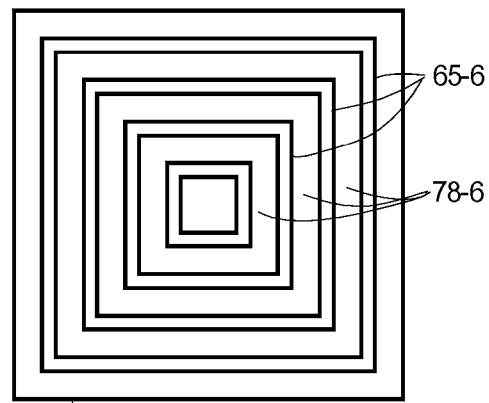

FIG. 6 shows a simplified schematic cross-sectional view through electronic element 44 comprising, by way of example, MOSFET 24 in active device region (ADR) 46 and bonding pad 35 in bonding pad region 60 on common semiconductor substrate 21, according to an embodiment of the present invention. FIGS. 7-8 are simplified schematic plan views of the electronic device of FIG. 6 according to still further embodiments of the invention. Considering FIGS. 6-8 together, ADR 46 is separated from bonding pad region 60 by coupling region 63 of length 64. ADR 46 and exemplary active device 24 are the substantially the same as shown and described in connection with ADR 22 and device 24 of FIGS. 3-5 and the description therein is incorporated herein by reference. MOSFET 24 is conventional and represents any type of active device. Bonding pad 35 in bonding pad region 60 overlies composite dielectric region (CDR) 62 of depth 624 and lateral dimensions 621, 622 (see FIGS. 6-8). Lateral dimensions 621, 622 of CDR 62 are chosen by the designer to accommodate bonding pad 35 of width 351 and length 352 (see FIGS. 7-8) placed over composite dielectric region (CDR) 62. Depth 624 of CDR 62 should be sufficient to substantially reduce the interaction with substrate 21 of E-M field 33 generated by bonding pad 35 during device operation. In most cases, depth 624 is usefully equal or greater than about 5 micro-meters, more conveniently equal or greater than about 10 micro-meters and preferably equal or greater than about 15 micro-meters.

It has been found that the adverse circuit loss, the adverse manufacturing yield impact and the adverse layout density impact (area bloat) that can be associated with deep dielectric region 36' of FIG. 3 can be ameliorated or avoided by providing composite dielectric region (CDR) 62 underlying bonding pad 35 of FIGS. 6-8, wherein region 62 includes multiple electrically floating column-like or blade-like polycrystalline or amorphous (i.e., non-single crystal) regions or inclusions 65, separated from each other by dielectric (e.g. oxide) portions 78. In a preferred embodiment where substrate 21 is of silicon, inclusions 65 are polycrystalline silicon but other materials of appropriate thermal expansion coefficient (TEC) can also be used. Inclusions 65 have width 80, separation 89 and center-to-center spacing 66. It has been found that the structure illustrated in FIG. 6 does not create the undesirable stress in substrate 21 as can arise with the arrangement of FIG. 5, and thereby minimizes or avoids the adverse impact on manufacturing yield, device properties and area bloat arising from such stress. The stress present in substrate 21 and adjacent active device region (ADR) 46 of electronic element 44 of FIGS. 6-8 incorporating composite dielectric region (CDR) 62 is much reduced compared to that which can be present in ADR 22 of element 20' of FIG. 5 incorporating deep dielectric region 36' without inclusions 65. Thus, element 44 comprising substrate 21 with CDR 62 under pad region 60, and with adjacent ADR 46 of FIGS. 5-8, not only exhibit superior performance characteristics by virtue of the reduced E-M coupling from bonding pad 35 to substrate 21 but also avoid the excessive manufacturing yield loss and area bloat associated with the arrangement of FIG. 5. It has been found that the manufacturing yield associated with the structure of element 44 of FIG. 6, is significantly greater than the manufacturing yield associated with an otherwise identical element 20' of FIG. 5. It is further found that length 64 of coupling region 63 can often be made much smaller in connection with CDR 62 without adverse effect, whereas, substantially larger coupling region 38' of FIG. 5 may have to be provided between pad region 34' and active device region 22 of element 20' in FIG. 5 in order to reduce the impact of the stress created by deep oxide region 36' on active device region 22. For example and not intended to be limiting, coupling region length 64 separating bonding pad region 60 from active device region 46 in device 44 can be made as small as 20 micrometers, whereas with the structure of FIG. 3, coupling region length 39 between pad region 34 and active device region 22 of device 20' must generally be of the order of 100 to 200 micrometers in order to avoid adverse stress effects. Thus, the adverse impact on circuit packing density of deep oxide region 36' is avoided. In summary, by using the structure of FIG. 6: (i) the adverse parasitic E-M coupling impact on bonding pad and interconnection impedances and on substrate loss is reduced, (ii) overall circuit efficiency is improved, (iii) substrate stress and its adverse impact on active device properties is minimized or avoided, and (iv) bonding pad region 60 can be placed closer to active device region 46, thereby avoiding the loss of circuit packing density (i.e. area bloat) and the increased impedance of longer interconnections 41' otherwise encountered with the arrangement of FIG. 5. These beneficial effects are highly desirable and a significant advance over the prior art.

FIGS. 7-8 illustrate in plan view various geometric arrangements of inclusions 65 separated by dielectric regions 78 in CDR 62, identified for convenience as CDR 62-1 having inclusions 65-1 and separating dielectric regions 78-1 of FIG. 7, and CDR 62-2 having inclusions 65-2 and separating dielectric regions 78-2 of FIG. 8. These are referred to collectively as CDRs 62, inclusions 65 and intervening dielectric (e.g., oxide) regions 78. Inclusions 65-1 and 65-2 extend across CDRs 62-1, 62-2 and are oriented at right angles to each other with respect to the orientation of device 24. In FIG. 7 the longer dimension of inclusions 65 are oriented in a direction not pointing toward active device region 46 (e.g., at right angles to device region 46). In FIG. 8 the longer dimension of inclusions 65 are oriented in a direction pointing toward active device region 46. The orientation of inclusions 65 in FIG. 8 is preferred. However, this is not intended to be limiting and any angular orientation of inclusions 65 with respect to device 24 in device region 46 may be used.

Figure 13:
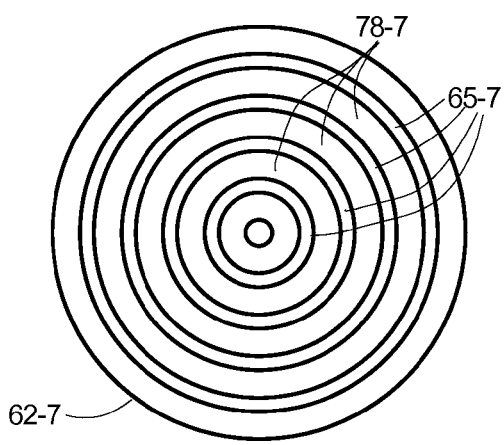
Figure 14:
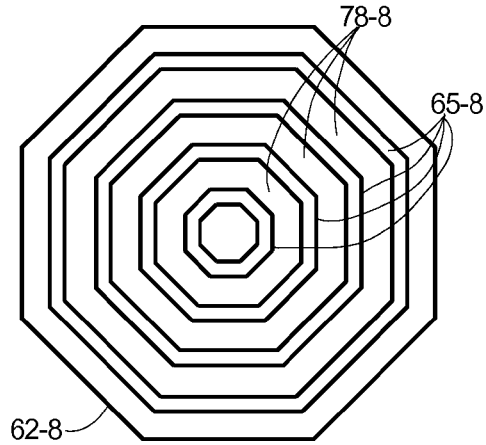

FIGS. 9-14 show simplified plan views of various dielectric regions (CDRs) 62-3 through 62-8 (collectively 62) containing electrically floating (e.g., polycrystalline or amorphous semiconductor) inclusions 65-3 through 65-8 (collectively 65) laterally separated by dielectric regions 78-3 through 78-8 (collectively 78) respectively, and suitable for use in improved bonding pad region 60 of integrated electronic element 44 of FIGS. 6-8, according to further embodiments of the present invention. As explained in connection with FIGS. 15-23, inclusions 65 are preferably formed in trenches and in plan view can have any of the arrangements illustrated in FIGS. 7-14. Inclusions 65 may be arranged in substantially parallel rows as illustrated for example in FIGS. 7-8, or in staggered rows as illustrated for example in FIG. 9, or in "L" or "T" shaped arrangements as illustrated for example in FIG. 10, or in a lattice-like arrangement where the openings in the lattice correspond to dielectric regions 78 as illustrated for example in FIG. 11, or in concentric rectangles, circles or polygons separated by dielectric regions 78 as illustrated for example in FIGS. 12-14. Any of these arrangements are suitable and provided by way of example and not by way of limitation. Other two-dimensional plan view arrangements of inclusions 65 may also be used. Where bonding pad 35 has a circular or polygonal plan view design, circular or polygonal arrangements of CDR 62 and inclusions 65 such as are illustrated in FIGS. 13-14 are particularly useful.

FIGS. 15-23 show simplified schematic cross-sectional views through semiconductor substrate 45 at different stages 115-123 of manufacture of CDR 62 of bonding pad region 60 of FIG. 6 adapted to support one or more bonding pads 35, according, to further embodiments of the present invention. In FIGS. 15-23, formation of CDR 62 is illustrated and conventional steps involved in the fabrication of active device(s) in adjacent ARD 46 are largely omitted. Hence, ADR 46 is not shown in FIGS. 15-22, but only included in FIG. 23. One or more active devices (e.g., see FIG. 6) can be fabricated in ADR 46, before, during or after manufacturing steps 115-122 of FIGS. 15-22 and such fabrication is included in manufacturing stage 123 of FIG. 23 merely by way of example and not intended to be limiting. Substrate 45 of FIGS. 15-23 is analogous to substrate 21 of FIG. 6, but is illustrated as having a particular conductivity type and including epi-layer 48 extending to upper surface 57 of substrate 45. This is intended merely by way of illustrating a variety of substrates, since such doping type and epi-layers are particularly useful for LDMOS devices, and not intended to be limiting. The doping type of substrate 45 and the presence or absence of epi-payer 48 has no significant effect on formation of CDR 62 and may be included or omitted in various embodiments of the invention.

Figure 15:
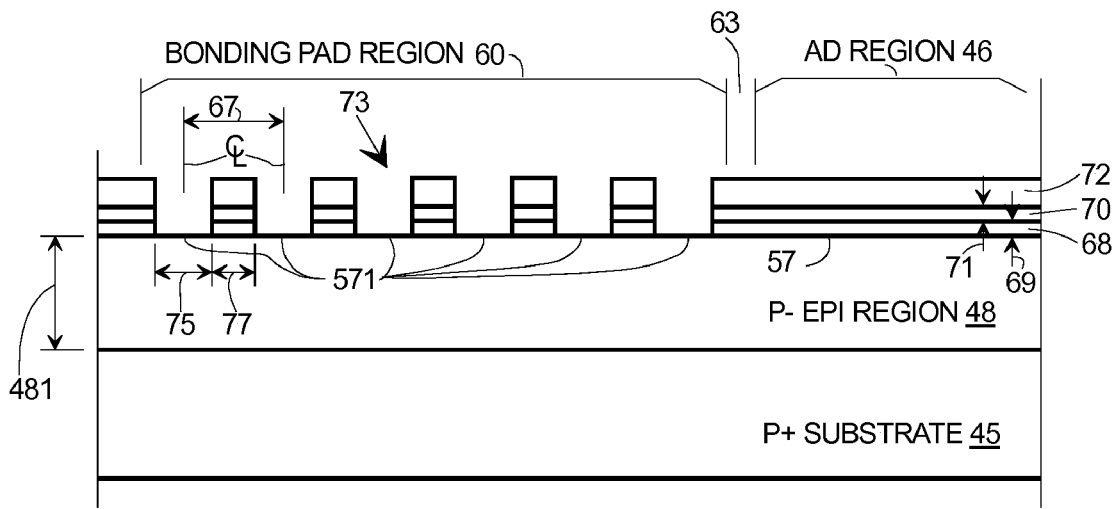
FIGS. 15-23 show simplified schematic cross-sectional views through a semiconductor substrate at different stages of manufacture of the dielectric regions of FIGS. 6-8 and 9-14 adapted to support bonding pads, according to yet further embodiments of the present invention.

Referring now to manufacturing stage 115 of FIG. 15, in a preferred embodiment P+silicon substrate 45 is provided having surface 57 and upper region 48 of thickness 481 of, for example, lightly doped P-type epi. In other embodiments, a lightly doped well region may replace epi-region 48 in active device region 46. Thickness 481 is usefully in the range of about 1 to 15 micrometers, more conveniently in the range of about 5 to 13 micrometers and preferably in the range of about 9 to 13 micrometers, but thicker and thinner layers can also be used and in other embodiments, upper region 48 may be omitted or provided by implantation or other doping means. Whether or not upper region 48 of thickness 481 and of the same or different doping than substrate 45 is needed will depend upon the type of devices the designer desires to form in ADR region 46 and is within the competence of those of skill in the art. Persons of skill in the art will also understand that description of a silicon substrate and silicon oxide dielectric in connection with FIGS. 15-23 is intended as examples of preferred embodiments and not by way of limitation to the exclusion of other types of semiconductor and dielectric materials.

Initial pad layer 68 of thickness 69 chosen for its compatibility and differential etchability with SC substrate 45 is desirably provided on SC surface 57. Silicon oxide is a suitable material for initial pad layer 68 but other materials can also be used. Thickness 69 is usefully in the range of about 0.02 to 0.2 micrometers, more conveniently in the range of about 0.04 to 0.17 micrometers and preferably in the range of about 0.1 to 0.17 micrometers, but thicker and thinner layers can also be used. Further pad layer 70 of thickness 71 is provided on initial pad layer 68. Further pad layer 70 is chosen for its ability to resist chemical reactions such as oxidation of underlying SC substrate 45, its differential etchability with respect to underlying initial pad layer 68 and its usefulness as a planarization etch stop or polishing stop. Silicon nitride is a suitable material for further pad layer 70 but other materials can also be used. Thickness 71 is usefully in the range of about 0.02 to 0.2 micrometers, more conveniently in the range of about 0.04 to 0.17 micrometers and preferably in the range of about 0.1 to 0.15 micrometers, but thicker and thinner layers can also be used. Hard mask layer 72 is provided on further pad layer 70. Silicon oxide formed for example by chemical vapor deposition (CVD) using tetra-ethyl-ortho-silicate (TEOS) reactants is a non-limiting example of a suitable material for hard mask 72, but other durable mask materials may also be used. Openings 73 are provided though hard mask layer 72, further pad layer 70 and initial pad layer 68, thereby exposing regions 571 of SC surface 57. Structure 215 results.

Figure 16:
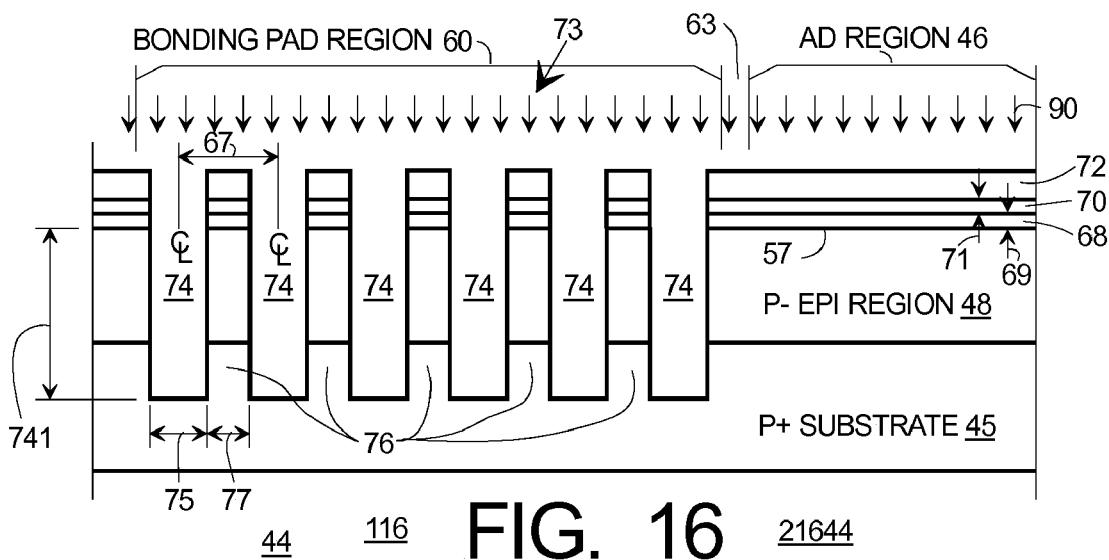

Referring now to manufacturing stage 116 of FIG. 16, etchant 90 that preferentially and anisotropically attacks semiconductor substrate 45 is directed through mask openings 73 to form trenches 74 extending into and/or through epi-payer 48 and into substrate 45 to depth 741. Depth 741 is usefully in the range of about 2 to 20 micrometers, more conveniently in the range of about 9 to 20 micrometers and preferably in the range of about 15 to 20 micrometers, but larger and smaller depths can also be used. The choice of etchant 90 depends upon the choice of material for SC substrate 45 and is within the competence of those of skill in the art. For silicon substrate 45, HBr and SiF4 in a helium-oxygen mixture is preferred for etchant 90, but other anisotropic etchants may also be used. The width and spacing of openings 73 are chosen so as to provide trenches 74 of width 75 separated by columns 76 of width 77 of SC material of substrate 45. Structure 216 results.

Figure 17:
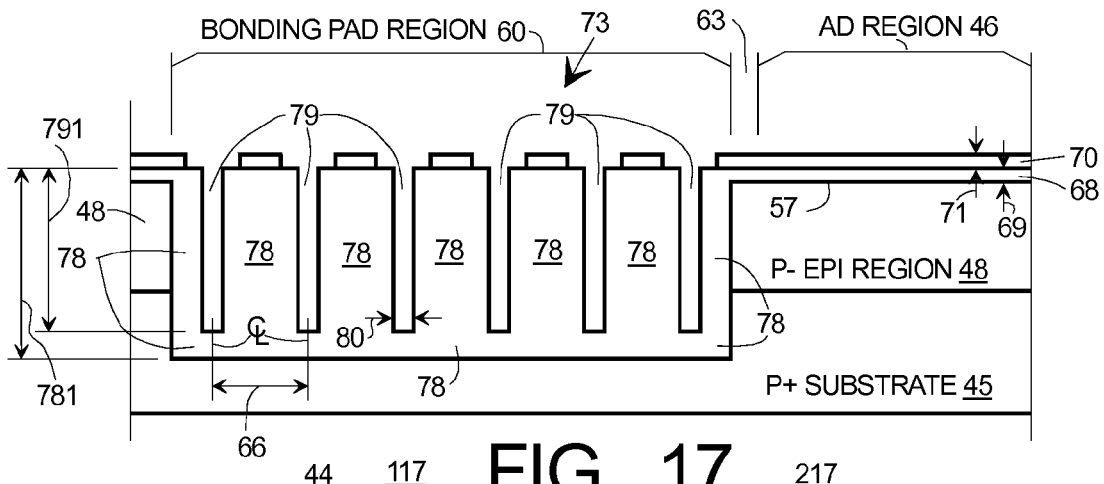

Referring now to manufacturing stage 117 of FIG. 17, hard mask layer 72 shown in FIG. 16 is removed and the semiconductor material exposed in trenches 74 is preferentially converted to dielectric. For silicon substrate 45, the resulting dielectric is preferably silicon dioxide. High pressure or stream oxidation of silicon substrate 45 is a preferred means for forming oxide regions 78 from the SC material exposed in trenches 74. Oxidation is carried out in this embodiment until substantially all of the SC material in SC substrate pillars or columns 76 is converted to silicon oxide. The silicon dioxide produced by oxidation of silicon pillars or columns 76 occupies a larger volume than the silicon consumed during oxidation. Thus, trenches 74 become narrower as oxidation proceeds. Trench widths 75 and column widths 77 are chosen (by appropriate selection of initial mask openings 73 and spacing) so that the oxide regions formed by oxidation of columns 76 do not close, but rather leave empty trenches or voids 79 of width 80 between adjacent oxide columns 78. Width 80 is usefully in the range of about 0.2 to 5.0 micrometers, more conveniently in the range of about 0.2 to 3.0 micrometers and preferably in the range of about 0.3 to 0.7 micrometers, but wider or narrower voids can also be used. By way of example and not intended to be limiting, in order to obtain void trenches 79 of width 80 of about 0.5 micro-meters, initial trench widths 75 of about 4.5 micrometers (see FIG. 16) separated by initial substrate column widths 77 of about 2.7 micrometers are used, thereby giving initial trench-to-trench centerline separation 67 of about 7.2 micrometers, assuming that SC columns 76 are fully converted to oxide in manufacturing stage 117. Centerline spacing 66 of inclusions 65 will be about equal to centerline spacing 67 of trenches 74. By adjusting initial trench width 75 and column width 77, different widths 80 of residual void trenches 79 can be obtained after SC substrate columns 76 are fully converted to oxide. Stated another way, width 75 is desirably about 8-10 times width 80 and centerline spacing 66 is desirably about 13-16 times width 80. Structure 217 results.

Figure 18:
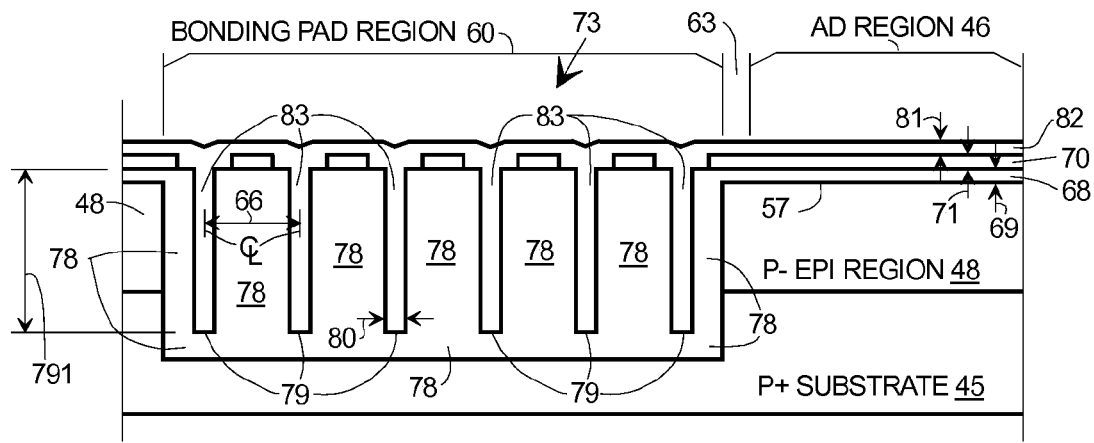

Referring now to manufacturing stage 118 of FIG. 18, non-single crystal material (e.g., poly or amorphous silicon) layer 82 is formed (e.g., by CVD) over bonding pad region 60 to thickness 81 sufficient to fill cavities 79 with inclusions 83. For convenience of explanation, it is assumed hereafter that layer 82 and inclusions 83 are poly or amorphous (i.e., non-single crystal) silicon, but other materials having a thermal expansion coefficient (TEC) less than that of dielectric 78 and/or closer to that of substrate 45 can also be used. Amorphous and or poly-crystalline (e.g., non-single crystal) silicon or germanium or combinations of silicon and germanium are non-limiting examples of other materials suitable for use with silicon or germanium or silicon-germanium substrates 45. Structure 218 results wherein, e.g., poly or amorphous silicon inclusions 83 are formed in trenches 79. By considering FIGS. 6-18 it will be appreciated that inclusions 83 can have a pillar-like or column-like or blade-like configuration, that is, their width 80 is generally significantly less than their height 791 and significantly less than their depth in the direction perpendicular to the plane of FIGS. 6 and 15-23, as can be seen in the plan views of FIGS. 7-14.

Figure 19:
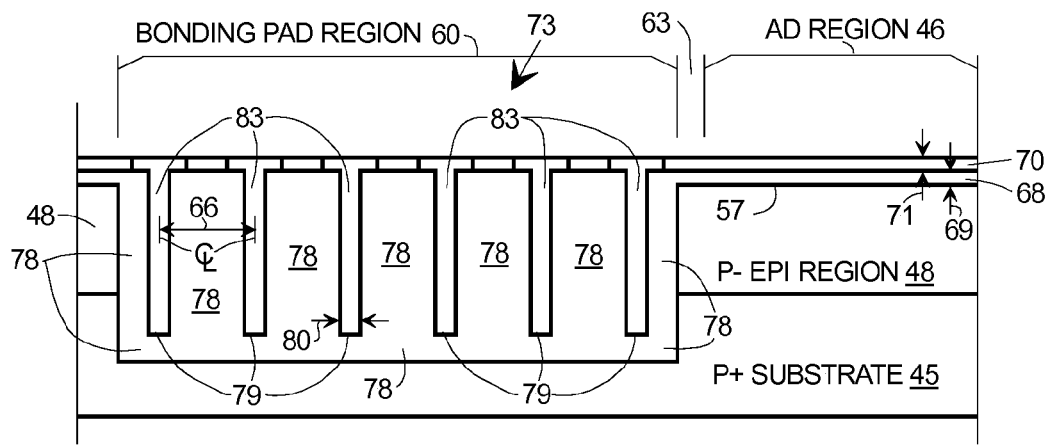

Referring now to manufacturing stage 119 of FIG. 19, the portion of layer 82 shown in FIG. 18 lying above further pad layer 70 is removed, leaving poly or amorphous silicon inclusions 83 untouched. Any planarization technique can be used. Photo-resist coating followed by etching of the photo resist (not shown) and poly or amorphous silicon layer 82 (the so called resist etch back technique) is a non-limiting example of a suitable planarization process, but other planarization technique, such as chemical mechanical polishing (CMP) may also be used to remove the excess portion of layer 82 above layer 70. Further pad layer 70 is useful as a planarization etch stop or polishing stop and facilitates the planarization process. Structure 219 results.

Figure 20:
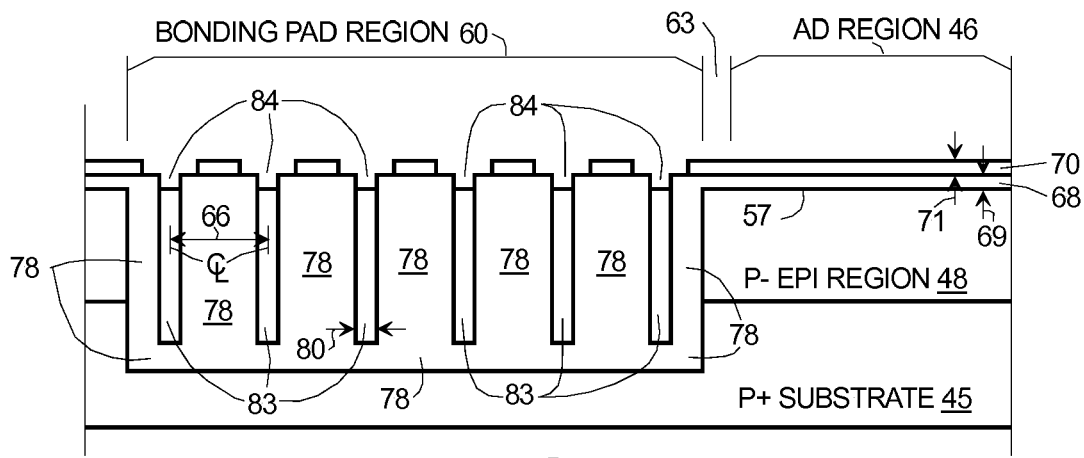

Referring now to manufacturing stage 120 of FIG. 20, portions 84 at the top of poly or amorphous silicon inclusions 83 are removed by a brief (e.g., silicon) etch. Removed portions 84 include the tops of inclusions 83 in trenches 79 (see FIG. 19) and more preferably lying above SC surface 57, but deeper or shallower etching may also be used. The particular etchant used will depend upon the choice of material for inclusions 83 and is within the competence of those of skill in the art. Where inclusions 83 are of poly or amorphous silicon, HBr and/or or HCl are suitable etchants. Structure 220 results.

Figure 21:
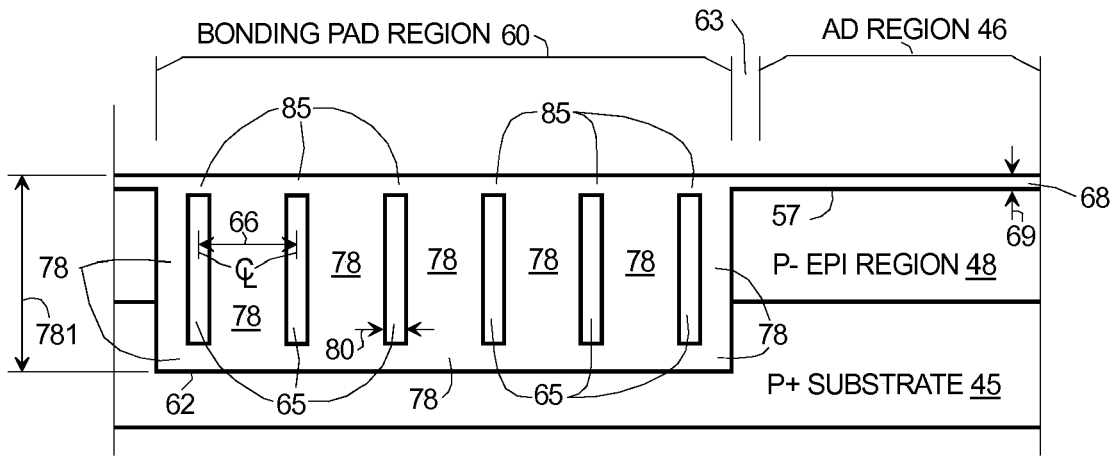
Figure 22:
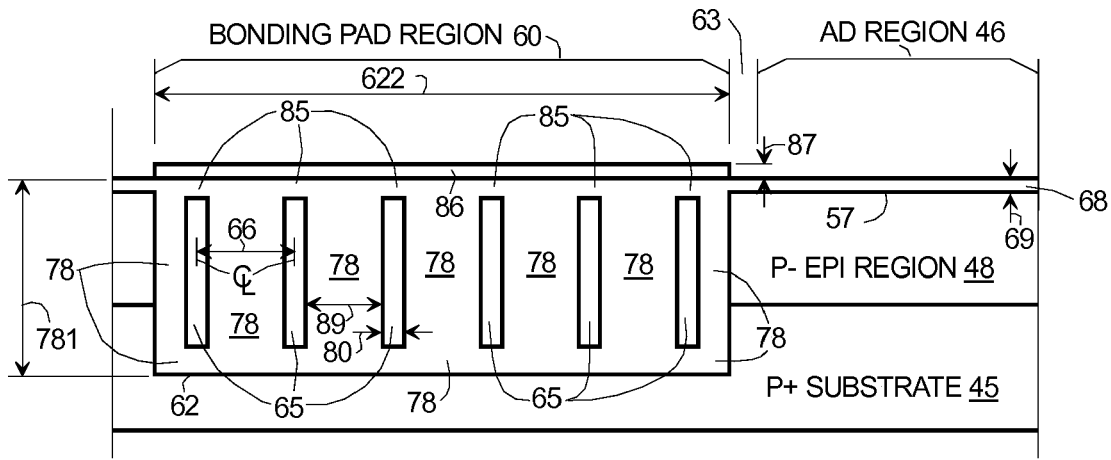
Figure 23:
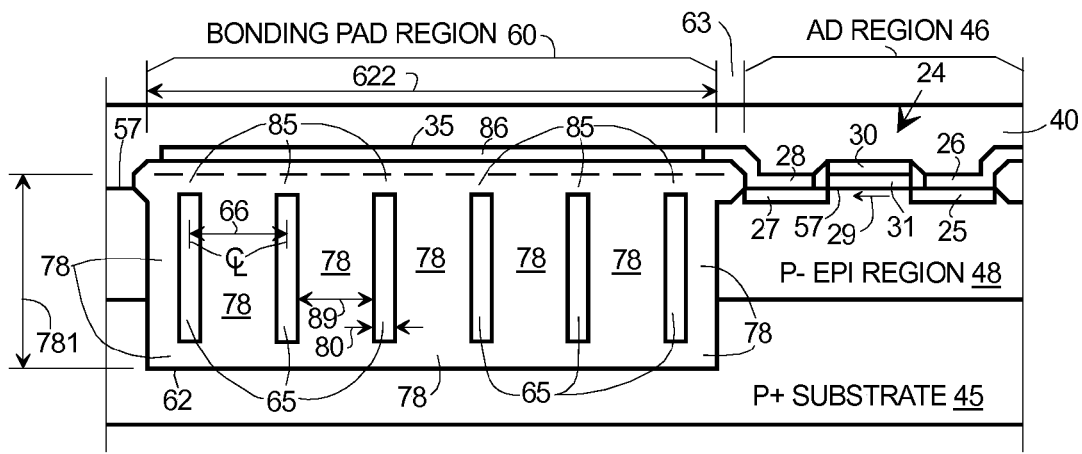

Referring now to manufacturing stage 121 of FIG. 21, the portions of (e.g., poly or amorphous silicon) inclusions 83 exposed in manufacturing stage 120 are, for example, oxidized to form dielectric regions 85 above electrically isolated (e.g., poly or amorphous silicon) inclusions 65 embedded within dielectric (e.g., silicon oxide) regions 78, thereby forming composite dielectric (isolation) region (CDR) 62 illustrated in FIGS. 6 and 21 of width 622 and depth 624 (see FIG. 6) or 781 (see FIG. 21) incorporating electrically isolated (e.g., poly or amorphous silicon) inclusions 65. Structure 221 results. Referring now to manufacturing stage 122 of FIG. 22, further dielectric layer 86, preferably of silicon nitride, and having thickness 87 is formed above composite dielectric region (CDR) 62. Structure 222 results. Referring now to manufacturing stage 123 of FIG. 23, active device 24 is conveniently formed in ADR 46 using means well known in the art. In this example, active device 24 is a MOSFET having source-drain (or drain-source) regions 25, 27 with contacts 26, 28 respectively, and gate dielectric 31 with gate 30 over channel 29, but this is merely by way of example and not intended to be limiting and any other type of active device can equally well be formed in ADR 60, before or during any manufacturing stage 115-123 of FIGS. 15-23. Pad layers 68, 70 and layer 86 are generally incorporated into or replaced by field oxide regions in connection with preparation of active device 24, and are generally ignored in FIG. 23, although layer 86 is shown as being incorporated in the upper portion of CDR 62 of FIG. 23. Bonding pad 35 is formed above CDR 62 in bonding pad region 60, conveniently at the same time as contacts 26, 28 of active device 24, but in other embodiments bonding pad 35 can be formed earlier or later in the manufacturing process. Either sequence is useful. Passivation layer 40 of, for example and not intended to be limiting, silicon oxide, silicon nitride or combinations thereof with or without various stabilization dopants is desirably applied over bonding pad region 60 and ADR 46. Structure 223 results. Electronic element 44 is then substantially complete. Interconnection 41 between, for example, drain metallization region 28 and bonding pad 35 is indicated. Coupling region 38 of length 39 between bonding pad region 60 and ADR 46 can be made very short because CDR 62 can be placed very close to, e.g. within about 20 micrometers of ADR 46.

Inclusions 65 can have aspect ratios, defined as their vertical height divided by their horizontal width 80 (see FIGS. 6 and 21-23), in the range of about 2 to 200, more conveniently about 15 to 50 and preferably about 20 to 30, but larger and smaller values can also be used. Their length in the direction perpendicular to the plane of FIGS. 6 and 20-23 can be much larger multiples of width 80 and will depend upon the lateral size of BONDING PAD 35 overlying CDR 62, as can be appreciated by inspecting the plan views presented in FIGS. 7-14.

Figure 24:
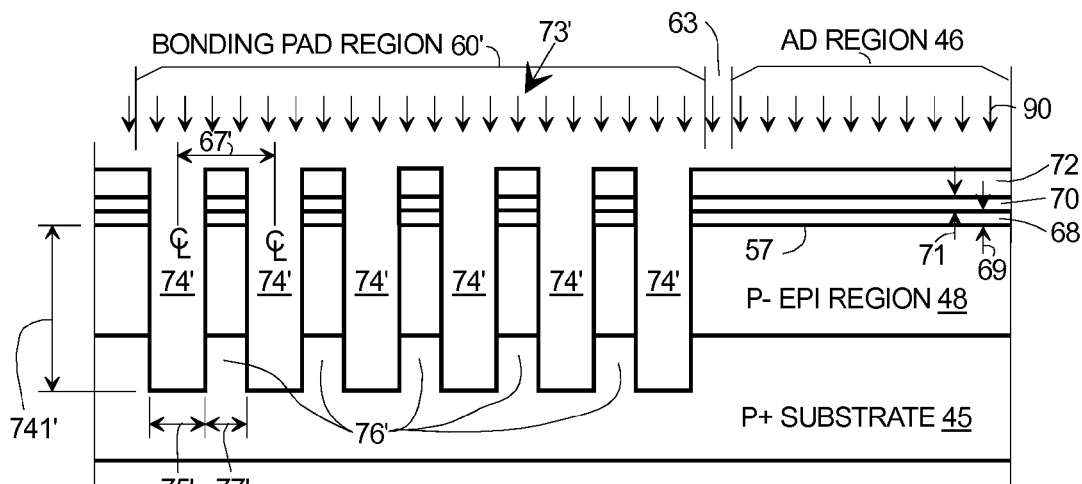
FIGS. 24-26 show simplified schematic cross-sectional views through a semiconductor substrate at different stages of manufacture of the dielectric regions of FIGS. 6-14 adapted to support bonding pads, according to still yet further embodiments of the present invention.
Figure 25:
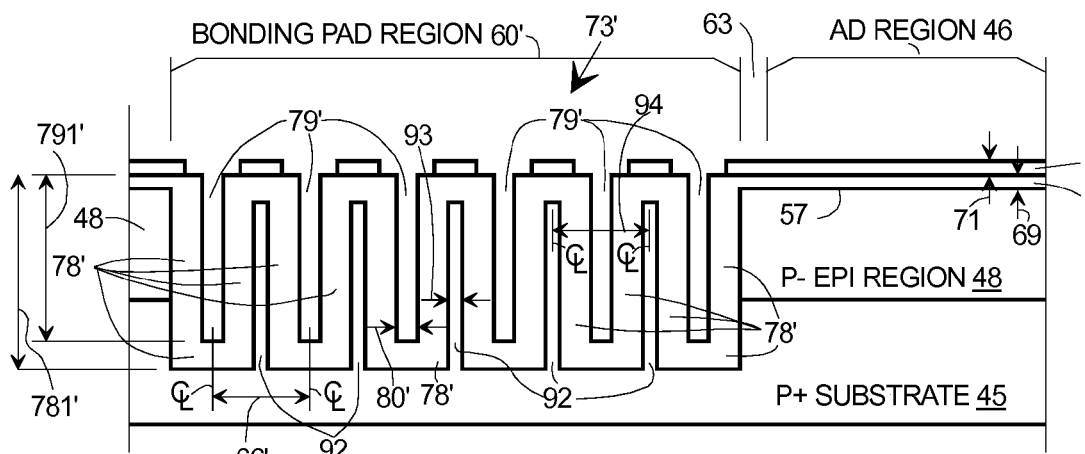
Figure 26:
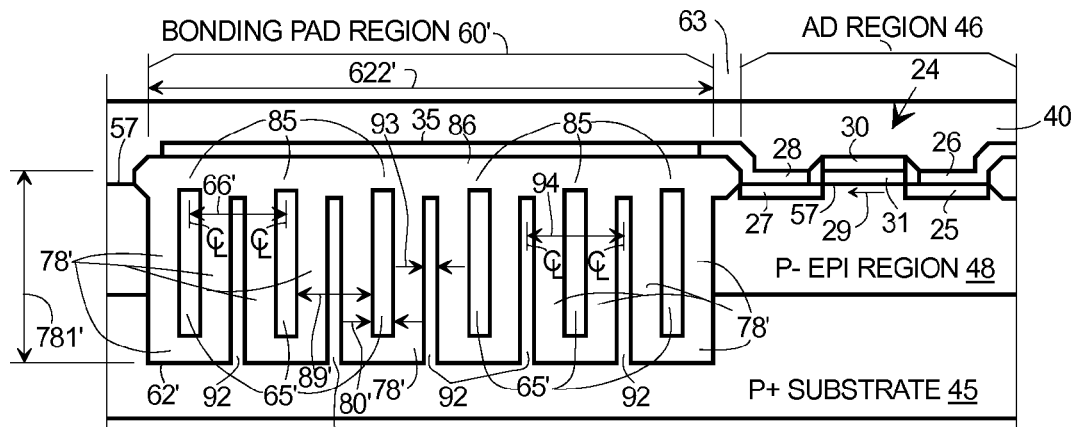

FIGS. 24-26 show cross-sectional views though semiconductor substrate 45 at different stages 124-126 of manufacture of CDR 62 of FIGS. 6 and 7-14 adapted to support one or more bonding pads 35, according, to still yet further embodiments of the present invention. In connection with FIGS. 24-26, the convention is adopted of identifying various regions similar to those of FIGS. 15-23 by the same reference numbers and identifying various regions analogous to those of FIGS. 15-23 but which may be different in some aspect(s) by using the same reference numbers supplemented by a prime ('). For example, substrate 45 can be the same and so is identified by the same reference number 45 in FIGS. 24-26 as in FIGS. 15-23, whereas trenches 74' and columns 76' of FIGS. 24-26 while analogous to trenches 74 and columns 76 of FIGS. 15-23 may be somewhat different and are, therefore, identified by the same reference numbers with a (') added. Manufacturing stage 124 of FIG. 24 yielding structure 224 is analogous to manufacturing stage 116 of FIG. 16 yielding structure 216 and the discussion thereof and preceding manufacturing stage 115 is incorporated herein by reference. What is different in manufacturing stage 124 and structure 224 is that trench widths 75' and column widths 77' are chosen (be means of adjusting mask openings 73') so that in subsequent manufacturing stage 125 of FIG. 25, SC substrate columns 76' are not oxidized to completion as in manufacturing stage 117 of FIG. 17, but leave un-oxidized SC substrate columns 92 (see FIG. 25) of width 93 in place undisturbed, embedded within oxide regions 78' containing void trenches 79' of width 80'. Widths 80' may be the same or different than widths 80 of FIGS. 17-23. As with manufacturing stage 117 of FIG. 17, in manufacturing stage 125 of FIG. 25 trenches 74' become narrower as oxidation proceeds. Trench widths 75' and column widths 77' are chosen (by appropriate selection of initial mask openings 73' and spacing) so that the oxide regions formed by partial oxidation of columns 76' do not close, but rather leave empty trenches or voids 79' of width 80' between adjacent oxide columns 78'. Width 80' is usefully in the range of about 0.2 to 5.0 micrometers, more conveniently in the range of about 0.2 to 3.0 micrometers and preferably in the range of about 0.3 to 0.7 micrometers, but wider or narrower voids can also be used. By way of example and not intended to be limiting, in order to obtain void trenches 79' of width 80' of about 0.5 micro-meters while leaving undisturbed SC substrate columns 92 of widths 93, initial trench widths 75' of about 4.5 micrometers (see FIG. 24) separated by initial substrate column widths 77' of about 3.7 micrometers are used, assuming that oxidation of SC substrate columns 76' is terminated before they are fully converted to oxide in manufacturing stage 125. By adjusting initial trench width 75' and column width 77' and the oxidation time, different widths 80' of residual void trenches 79' can be obtained after SC substrate columns 76' are partially converted to oxide while leaving embedded within dielectric regions 78', SC substrate columns 92 of width 93. Structure 225 results from manufacturing stage 125 of FIG. 25. Structure 225 then proceeds through substantially the same manufacturing stages associated with FIGS. 18-23 and the discussion thereof is incorporate herein by reference. Manufacturing stage 126 of FIG. 26 is analogous to manufacturing stage 123 of FIG. 23 with the difference that residual SC substrate columns 92 of width 93 and spacing 94 are incorporated in CDR 62' of electronic element 44'. Active device 24 can be formed before, during or after formation of CDR 62' and bonding pad 35.

Figure 27:
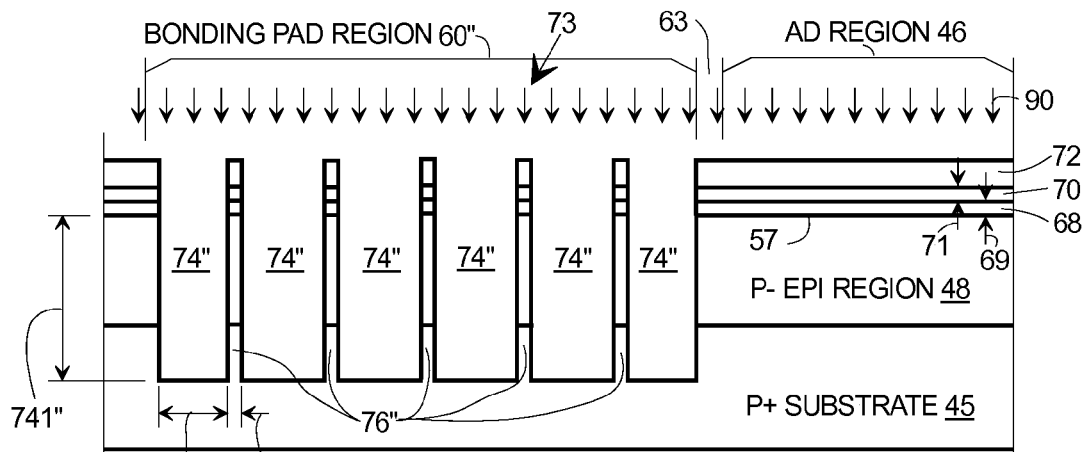
Figure 28:
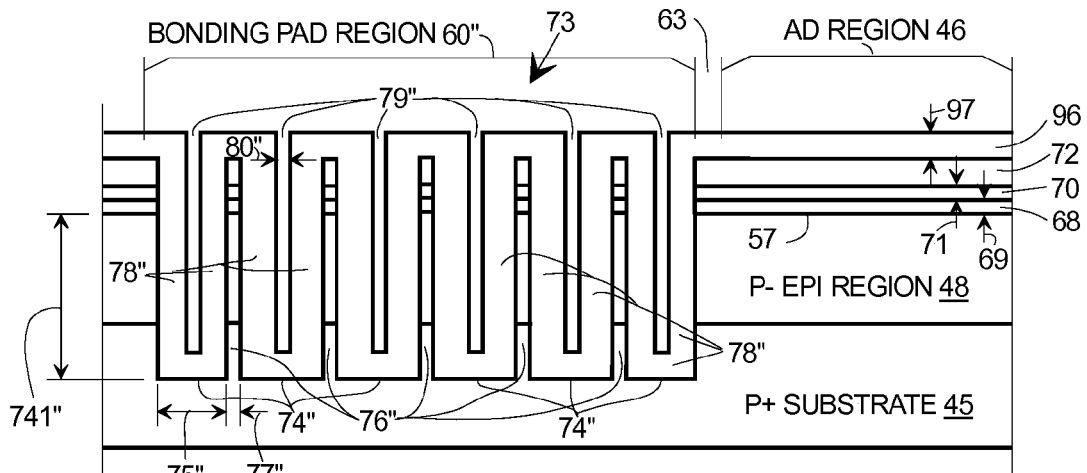

FIGS. 27-31 show cross-sectional views though semiconductor substrate 45 at different stages of manufacture 127-131 of CDR 62 of FIGS. 6 and 7-14 adapted to support one or more bonding pads 35, according, to yet still further embodiments of the present invention. In connection with FIGS. 27-31, the convention is adopted of identifying various regions similar to those of FIGS. 15-23 by the same reference numbers and identifying various regions analogous to those of FIGS. 15-23 but which may be different in some aspect(s) by using the same reference numbers supplemented by a double prime ("). For example, substrate 45 can be the same and so is identified by the same reference number 45 in FIGS. 27-31 as in FIGS. 15-23, whereas trenches 74" and columns 76" of FIGS. 27-31, while analogous to trenches 74 and columns 76 of FIGS. 15-23 may be somewhat different and are, therefore, identified by the same reference numbers with a (") added. Manufacturing stage 127 of FIG. 27 yielding structure 227 is analogous to manufacturing stage 116 of FIG. 16 yielding structure 216 and the discussion thereof and preceding manufacturing stage 115 is incorporated herein by reference. What is different in manufacturing stage 127 and structure 227 of FIG. 27 is that trench widths 75" and column widths 77" are chosen (by means of adjusting mask openings 73") so that in subsequent manufacturing stage 128 of FIG. 28, dielectric regions 78" and voids 79" can be produced by deposition rather than by oxidation of substrate columns 76". In manufacturing stage 127 of FIG. 27, trenches 74" of widths 75" separated by substrate columns 76" (including portions of overlying pad layers 68, 70 on top of columns 76") are etched in substrate 45 to depth 741". Structure 227 results. Referring now to manufacturing stage 128 of FIG. 28, dielectric layer 96 of thickness 97 is formed preferably conformally over structure 227. CVD silicon oxide is a suitable material for layer 96. Any CVD process may be used, but deposition employing TEOS is convenient. Thickness 97 is chosen so that layer 96 coats the sidewalls of trenches 74" leaving unfilled voids 79" of width 80" substantially centrally located within trenches 74". Structure 228 results.

Referring now to manufacturing stage 129 of FIG. 29, layer 82" of thickness 81" analogous to layer 82 of FIG. 18 is formed over structure 228, thereby filling void trenches 74" and creating inclusions 83" in much the same manner as described for void trenches 74 and inclusions 83 of manufacturing stage 118 of FIG. 18, the discussion of which is incorporated herein by reference. Structure 229 results. While manufacturing stage 129 of FIG. 29 illustrates the situation where mask 72 is left in place during deposition of layer 82", in other embodiments, mask layer 72 may be removed prior to such deposition. Either arrangement or sequence is useful. Referring now to manufacturing stage 130 of FIG. 30, structure 229 is planarized in much the same manner as has been previously described in connection with manufacturing stage 119 of FIG. 19, the discussion of which is hereby incorporated by reference. Structure 230 results. Advantage is also taken of the presence of further pad layer 70 which provides a convenient planarization polish stop and/or etch stop. Structure 230 is then subjected to manufacturing stages analogous to manufacturing stages 120-123 of FIGS. 20-23, the discussion of which is incorporated herein by reference, culminating in manufacturing stage 131 of FIG. 31 analogous to manufacturing stage 123 of FIG. 23, with the difference that residual SC substrate columns 92" of width 93" and spacing 94" are incorporated in CDR 62" of electronic element 44". Poly or amorphous inclusions 65" of width 80" and separation 89" and center-to-center distance 66" are provided in deposited dielectric regions 78" having therein substantially un-oxidized substrate columns 92". Poly or amorphous inclusions 65" are electrically floating and residual substrate columns 92" are separated from bonding pad 35 by at least portions 70" and 68" of pad layers 70, 68 and layer 86 or their subsequently formed equivalents, thereby limiting their coupling to the E-M field generated by bonding pad 35. Active device 24 can be formed before, during or after formation of CDR 62" and bonding pad 35.

According to a first embodiment, there is provided an electronic element (44, 44', 44"), comprising, a semiconductor (SC) substrate (45) having a first thermal expansion coefficient (TEC) and an active device region (46) and a bonding pad region (60), a bonding pad (35) located in the bonding pad region (60), a composite dielectric region (62, 62', 62") located in the bonding pad region (60) underlying the bonding pad (35) and comprising an insulating material (78, 78', 78") having a second TEC, inclusions (65, 65', 65") of a further material (82, 82"; 83, 83") within the composite dielectric region (62, 62', 62"), the further material (82, 82"; 83, 83") having a third TEC less than the second TEC, wherein the inclusions (65, 65', 65") are electrically isolated from the substrate (45) and the bonding pad (35), and an active device (24) located in the active device region (46) and proximate the composite dielectric region (62, 62', 62"), having a first terminal electrically coupled to the bonding pad (35) by an interconnection (41, 41', 41"). According to a further embodiment, the substrate (45) comprises silicon or germanium or a combination thereof and the inclusions (65, 65', 65") comprise a non-single crystal form of silicon or germanium or a combination thereof. According to a still further embodiment, the inclusions (65, 65', 65") have a width (80) in the range of about 0.2 to 5.0 micrometers. According to a yet further embodiment, the inclusions (65, 65', 65") have a width (80) and a centerline-to-centerline spacing (66) of about 13-16 times their width (80). According to a still yet further embodiment, the inclusions (65, 65', 65") have an aspect ratio in the range of about 2 to 200. According to a yet still further embodiment, the inclusions (65, 65', 65") have an aspect ratio in the range of about 15 to 50. According to another embodiment, the inclusions (65, 65', 65") have an aspect ratio in the range of about 20 to 30. According to a still another embodiment, the inclusions (65, 65', 65") comprise multiple substantially parallel blade-like shapes (65-1, 65-2, 65-3) in plan view. According to a yet another embodiment, the inclusions (65-2) have a long dimension in plan view oriented toward the active device. According to a still yet another embodiment, the inclusions (65-1) have a long dimension in plan view not oriented toward the active device. According to a yet still another embodiment, the inclusions (65-6, 65-7, 65-8) form substantially concentric shapes in plan view. According to an additional embodiment, the composite dielectric region (62, 62', 62") is located within about 20 micrometers or less of the active device region (46).

According to a second embodiment, there is provided a method (115-131) for forming an electronic element (44, 44', 44") incorporating a composite dielectric region (CDR) (62, 62', 62") under a bonding pad (35) coupled to an active device (24), comprising, providing (115, 124, 127) a semiconductor substrate (45) of a first material having a first thermal expansion coefficient (TEC) and having a first surface (57), wherein the substrate (45) has therein a first region (46) adapted to receive the active device (24) and a second region (60) adapted to receive the bonding pad (35), forming (115, 124, 127) a mask (72) on the second region (60), the mask having spaced-apart openings (73, 73', 73") of a first width (75, 75', 75"), etching (116, 124, 127) space-apart trenches (74, 74', 74") of substantially the first width (75, 75', 75") to a first depth (741, 741") in the substrate (45), leaving columns (76, 76', 76") of substantially undisturbed substrate (45) material between the trenches (74, 74', 74") and other portions of the substrate (45) material beneath the trenches (74, 74', 74"), forming (117, 125, 128) dielectric (78, 78', 78") having a second TEC in the trenches (74, 74', 74") so that a substantially centrally located void (79, 79', 79") is present in the dielectric (78, 78', 78") extending from the first surface (57) into the trench (74, 74', 74") but not extending to other portions of the substrate (45) material beneath the trench (74, 74', 74"), filling (118, 129) the trench (74, 74', 74") with an inclusion material (83, 83"; 65. 65', 65") electrically floating with respect to the substrate (45) and having a third TEC less than the second TEC, wherein the combination of the dielectric (78, 78', 78") and the electrically floating inclusion material (83, 83"; 65. 65', 65") therein forms the composite dielectric region (62, 62', 62") adapted to support the bonding pad (35), forming (123, 126, 131) the active device (24) in an active device region (46) proximate the dielectric region (62, 62', 62") wherein the active device (24) has a first terminal (28), forming (123, 126, 131) the bonding pad (35) on the dielectric region (62, 62', 62") above the dielectric (78, 78', 78") and inclusion material (83, 83"; 65, 65', 65") electrically isolated from the inclusion material (83, 83"; 65, 65', 65"), and electrically coupling the bonding pad (35) to the first terminal (28) of the active device. According to a further embodiment, the inclusion material (82, 82"; 83, 83"; 65, 65', 65") comprises silicon or germanium or combinations thereof. According to a still further embodiment, the first material comprises silicon or germanium or combinations thereof. According to a yet further embodiment, the inclusion material (82, 82"; 83, 83"; 65, 65', 65") has a plan view a shape comprising one or more substantially continuous parallel multiple rows (65-1, 65-2) or interrupted multiple substantially parallel rows (65-3), or multiple "L" or "T" shaped rows (65-4, 65-5), or an X-Y shaped array of multiple rows (65-5), or concentric rectangles, circles or polygons (65-6, 65-7, 65-8).

According to a third embodiment, there is provided an electronic device (44, 44', 44") comprising, a semiconductor substrate (45) having therein a bonding pad region (60) and an active device region (46), a bonding pad (35) electrically isolated from the substrate (45), a composite dielectric region (62, 62', 62") on the substrate (45) in the bonding pad region (60) and underlying the bonding pad (35), wherein the composite dielectric region (62, 62', 62") comprises insulating dielectric regions (78, 78', 78", 85, 68, 70, 86) and non-single crystal semiconductor inclusion regions (65, 65', 65"), the inclusion regions (65, 65', 65") being electrically isolated from the bonding pad (35) and the substrate (45) by portions of the insulating dielectric regions (78, 78', 78", 85, 68, 70, 86), and an active device (24) in the active device region (46) electrically coupled to the bonding pad (35) by an interconnection (41, 41', 41"). According to a further embodiment, the substrate (45) has a resistivity less than about 0.1 Ohm-cm. According to a still further embodiment, the bonding pad region (60) is separated from the active device region (46) by a coupling region (38) of length (39) less than or equal to about 20 micrometers. According to a yet further embodiment, the inclusion regions (65, 65', 65") comprise multiple substantially parallel rows (65-2) in plan view of semiconductor material (82) oriented in a direction pointing toward the active device region (46).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming an electronic element incorporating a composite dielectric region (CDR) under a bonding pad coupled to an active device, comprising:
    providing a semiconductor substrate having therein a bonding pad region and an active device region;
    forming a composite dielectric region on the substrate in the bonding pad region and underlying the bonding pad, wherein forming the composite dielectric region comprises:
        forming insulating dielectric regions, and
        forming non-single crystal semiconductor inclusion regions, the inclusion regions being electrically isolated from the bonding pad and the substrate by portions of the insulating dielectric regions that cover top surfaces of the inclusion regions, and that are located at sides of the inclusion regions;
    forming a bonding pad overlying the insulating dielectric regions and electrically isolated from the substrate; and
    forming an active device in the active device region electrically coupled to the bonding pad by an interconnection.

2. The method of claim 1, wherein the substrate has a resistivity less than about 0.1 Ohm-cm.

3. The method of claim 2, wherein the bonding pad region is formed so that the bonding pad region is separated from the active device region by a coupling region of length less than or equal to about 20 micrometers.

4. The method of claim 2, wherein forming the inclusion regions comprises forming multiple substantially parallel rows in plan view of semiconductor material oriented in a direction pointing toward the active device region.

5. A method for forming an electronic element incorporating a composite dielectric region (CDR) under a bonding pad coupled to an active device, comprising:
    providing a semiconductor (SC) substrate having a first thermal expansion coefficient (TEC) and an active device region and a bonding pad region;
    forming a dielectric region located in the bonding pad region and comprising an insulating material having a second TEC;
    forming inclusions of a further material within the dielectric region, the further material having a third TEC less than the second TEC;
    forming further dielectric regions to cover the inclusions;
    forming a bonding pad in the bonding pad region and overlying the further dielectric regions, wherein the dielectric region and the further dielectric region electrically isolate the inclusions from the substrate and the bonding pad; and
    forming an active device located in the active device region and proximate the composite dielectric region, having a first terminal electrically coupled to the bonding pad by an interconnection.

6. The method of claim 5, wherein the substrate comprises silicon or germanium or a combination thereof and the inclusions comprise a non-single crystal form of silicon or germanium or a combination thereof.

7. The method of claim 5, wherein the inclusions have a width in the range of about 0.2 to 5.0 micrometers.

8. The method of claim 7, wherein the inclusions have a width and a centerline-to-centerline spacing of about 13-16 times their width.

9. The method of claim 5, wherein the inclusions have an aspect ratio in the range of about 2 to 200.

10. The method of claim 9, wherein the inclusions have an aspect ratio in the range of about 15 to 50.

11. The method of claim 10, wherein the inclusions have an aspect ratio in the range of about 20 to 30.

12. The method of claim 5, wherein forming the inclusions comprises forming multiple substantially parallel blade-like shapes in plan view.

13. The method of claim 12, wherein the inclusions have a long dimension in plan view oriented toward the active device.

14. The method of claim 12, wherein the inclusions have a long dimension in plan view not oriented toward the active device.

15. The method of claim 5, wherein the inclusions form substantially concentric shapes in plan view.

16. The method of claim 5, wherein the composite dielectric region is located within about 20 micrometers or less of the active device region.

17. A method for forming an electronic element incorporating a composite dielectric region (CDR) under a bonding pad coupled to an active device, comprising:
   providing a semiconductor substrate of a first material having a first thermal expansion coefficient (TEC) and having a first surface, wherein the substrate has therein a first region adapted to receive the active device and a second region adapted to receive the bonding pad;
   forming a mask on the second region, the mask having spaced-apart openings of a first width;
   etching space-apart trenches of substantially the first width to a first depth in the substrate, leaving columns of substantially undisturbed substrate material between the trenches and other portions of the substrate material beneath the trenches;
   forming dielectric having a second TEC in the trenches so that a substantially centrally located void is present in the dielectric extending from the first surface into the trenches but not extending to other portions of the substrate material beneath the trenches;
   filling the trenches with an inclusion material electrically floating with respect to the substrate and having a third TEC less than the second TEC;
   forming dielectric regions to cover the inclusion material, wherein the combination of the dielectric, the dielectric regions, and the electrically floating inclusion material therein forms the composite dielectric region adapted to support the bonding pad;
   forming the active device in an active device region proximate the composite dielectric region wherein the active device has a first terminal;
   forming the bonding pad on the composite dielectric region above the dielectric and inclusion material electrically isolated from the inclusion material; and
   electrically coupling the bonding pad to the first terminal of the active device.

18. The method of claim 17, wherein the inclusion material comprises silicon or germanium or combinations thereof.

19. The method of claim 18, wherein the first material comprises silicon or germanium or combinations thereof.

20. The method of claim 17, wherein the inclusion material has a plan view shape comprising one or more substantially continuous parallel multiple rows or interrupted multiple substantially parallel rows, or multiple "L" or "T" shaped rows, or an X-Y shaped array of multiple rows, or concentric rectangles, circles or polygons.

* * * * *